(12) United States Patent
Kelly et al.

(10) Patent No.: US 12,501,574 B2
(45) Date of Patent: Dec. 16, 2025

(54) CABINET AIR DAM ENCLOSURE

(71) Applicant: Panduit Corp., Tinley Park, IL (US)

(72) Inventors: Brian L. Kelly, Oak Forest, IL (US);
Kevin A. Marley, Joliet, IL (US);
Shawn T. Kemp, Crete, IL (US);
Andrew R. Matcha, Chicago, IL (US);
Eric W. Sanders, LaGrange, IL (US)

(73) Assignee: Panduit Corp., Tinley Park, IL (US)

( * ) Notice: Subject to any disclaimer, the term of this patent is extended or adjusted under 35 U.S.C. 154(b) by 381 days.

(21) Appl. No.: 18/105,908

(22) Filed: Feb. 6, 2023

(65) Prior Publication Data

US 2023/0269900 A1 Aug. 24, 2023

Related U.S. Application Data

(60) Provisional application No. 63/342,677, filed on May 17, 2022, provisional application No. 63/311,529, filed on Feb. 18, 2022.

(51) Int. Cl.
| | |
|---|---|
| *H05K 7/20* | (2006.01) |
| *H05K 5/02* | (2006.01) |
| *H05K 7/14* | (2006.01) |

(52) U.S. Cl.
CPC .......... *H05K 7/20145* (2013.01); *H05K 5/02* (2013.01); *H05K 7/1488* (2013.01)

(58) Field of Classification Search
CPC .. H05K 55/00; H05K 5/00344; H05K 5/0039; H05K 5/0073; H05K 5/02; H05K 5/0204; H05K 5/0213; H05K 5/0217; H05K 5/0256; H05K 5/0226; H05K 5/023; H05K 5/04; H05K 5/10; H05K 5/30; H05K 7/00; H05K 7/1421; H05K 7/1487; H05K 7/1488; H05K 7/1489; H05K 7/1494; H05K 7/18; H05K 7/183; H05K 7/186; H05K 7/20; H05K 7/20145; H05K 7/20736; H05K 7/20754; G06F 1/181; G06F 1/182;
(Continued)

(56) References Cited

U.S. PATENT DOCUMENTS

| | | | |
|---|---|---|---|
| 6,554,142 B2 * | 4/2003 | Gray | A47B 57/30 211/175 |
| 6,726,164 B1 | 4/2004 | Baiza et al. | |
| 6,769,551 B2 | 8/2004 | Rafferty et al. | |

(Continued)

FOREIGN PATENT DOCUMENTS

EP 3402318 A1 11/2016

*Primary Examiner* — Daniel J Troy
*Assistant Examiner* — Elizabeth Irene Artalejo
(74) *Attorney, Agent, or Firm* — Christopher K. Marlow; Christopher S. Clancy; James H. Williams

(57) ABSTRACT

A cabinet defined by a frame with front vertical posts, back vertical posts, and front to back beams extending from the front vertical posts to the back vertical posts. Equipment rails are secured to the frame at the front and the back of the cabinet. The equipment rails include vertically orientated holes extending there through. The vertically orientated hole in one of the front equipment rails is aligned with the vertically orientated hole in one of the back equipment rails to create a pathway between the vertically orientated holes. An enclosure is installed in the pathway between the aligned vertically orientated holes thereby connecting the front equipment rail to the back equipment rail.

7 Claims, 15 Drawing Sheets

(58) Field of Classification Search
CPC ......... G06F 1/183; A47B 4/03; A47B 83/001; A47B 95/02; A47B 96/025; A47B 96/07
USPC ... 312/204, 223.1, 223.2, 264.1, 265.1, 304, 312/334.7; 361/679.01, 679.02, 724, 725, 361/727

See application file for complete search history.

(56) References Cited

U.S. PATENT DOCUMENTS

| | | | |
|---|---|---|---|
| 7,016,191 B2 | 3/2006 | Miyamoto et al. | |
| 7,193,857 B2 | 3/2007 | Robbins et al. | |
| 7,293,666 B2 * | 11/2007 | Mattlin | H01R 11/01 312/257.1 |
| 7,591,383 B1 | 9/2009 | Milton | |
| 7,764,495 B2 | 7/2010 | Hruby et al. | |
| 8,257,155 B2 | 9/2012 | Lewis, II | |
| 8,355,246 B2 * | 1/2013 | Linhares, Jr. | H05K 7/20736 361/679.5 |
| 8,653,363 B2 | 2/2014 | Behrens et al. | |
| 8,925,739 B2 | 1/2015 | Crippen et al. | |
| 9,185,824 B2 | 11/2015 | Nordin et al. | |
| 9,351,427 B2 | 5/2016 | Lewis, II et al. | |
| 9,420,727 B2 | 8/2016 | Lewis, II et al. | |
| 9,549,487 B2 | 1/2017 | Lewis, II et al. | |
| 9,642,270 B2 | 5/2017 | Lewis, II et al. | |
| 9,674,981 B1 | 6/2017 | Cox et al. | |
| 9,814,159 B2 | 11/2017 | Lewis, II et al. | |
| 9,861,004 B2 | 1/2018 | Anderson et al. | |
| 9,949,406 B2 | 4/2018 | Lewis, II et al. | |
| 9,980,400 B2 | 5/2018 | Lewis, II et al. | |
| 10,021,805 B2 | 7/2018 | Cox et al. | |
| 10,076,049 B2 | 9/2018 | Nordin et al. | |
| 10,356,925 B2 | 7/2019 | Nordin et al. | |
| 10,356,951 B2 | 7/2019 | Lewis, II et al. | |
| 10,405,451 B2 | 9/2019 | Anderson et al. | |
| 10,674,627 B2 | 6/2020 | Chen et al. | |
| 10,674,634 B2 | 6/2020 | Lewis, II et al. | |
| 10,827,643 B2 | 11/2020 | Sassano et al. | |
| 11,083,108 B2 | 8/2021 | Lewis, II et al. | |
| 2012/0112611 A1 | 5/2012 | Chen et al. | |
| 2012/0201002 A1 | 8/2012 | Schmitt et al. | |
| 2014/0027392 A1 | 1/2014 | Crippen et al. | |
| 2016/0135329 A1 | 5/2016 | Lewis, II | |
| 2016/0330858 A1 | 11/2016 | Ehlen | |
| 2020/0100384 A1 | 3/2020 | Sassano et al. | |

\* cited by examiner

CABINET AIR DAM ENCLOSURE

CROSS REFERENCE TO RELATED APPLICATION(S)

This application claims benefit to U.S. Provisional Patent Application No. 63/311,526, filed on Feb. 18, 2022 and U.S. Provisional Patent Application No. 63/342,677, filed on May 17, 2022, the entirety of which is hereby incorporated by reference herein.

FIELD OF THE INVENTION

The present invention relates to a cabinet, and more particularly to an enclosure installed in the air dam of a cabinet.

BACKGROUND OF THE INVENTION

Data centers are highly conditioned and controlled for humidity, temperature, and dust to protect the cabinets and equipment installed therein. In a typical data center, cabinets are positioned in the data center to maximize the available floor space in the data center. The cabinets provide racking for servers, switches, and other equipment. As illustrated in FIG. 1, the space in a cabinet 20 that receives equipment is called a rack unit 24 (RU). The rack unit (RU) extends between two equipment rails 22 installed at each side of the cabinet. A rack unit 24 (RU) space is 1.75"×19" in a horizontal orientation. Data center operators use every rack unit (RU) of space that they can to maximize the utilization of the data center space. When all of the rack units (RUs) within a cabinet are exhausted, a data center operator must install another cabinet or revert to alternative methods of racking or supporting equipment. One example is that equipment has been installed above cabinets in some data centers. However, installation above the cabinet is not a suitable solution in most applications.

Thus, it would be desirable to provide additional rack unit (RU) space in a cabinet for mounting equipment within the cabinet.

SUMMARY OF THE INVENTION

A cabinet defined by a frame with a pair of front vertical posts, a pair of back vertical posts, top side to side beams, bottom side to side beams, and front to back beams extending from one of the front vertical posts to one of the back vertical posts. At least one front equipment rail is secured to the frame and at least one back equipment rail is secured to the frame. The front equipment rail and the back equipment rail each have a vertically orientated hole extending there through. The vertically orientated hole of the front equipment rail is aligned with the vertically orientated hole of the back equipment rail to create a pathway between the vertically orientated holes. An enclosure is installed in the pathway between the aligned vertically orientated holes in the front equipment rail and the back equipment rail. The enclosure connects the front equipment rail to the back equipment rail.

DETAILED DESCRIPTION

Figure 1:
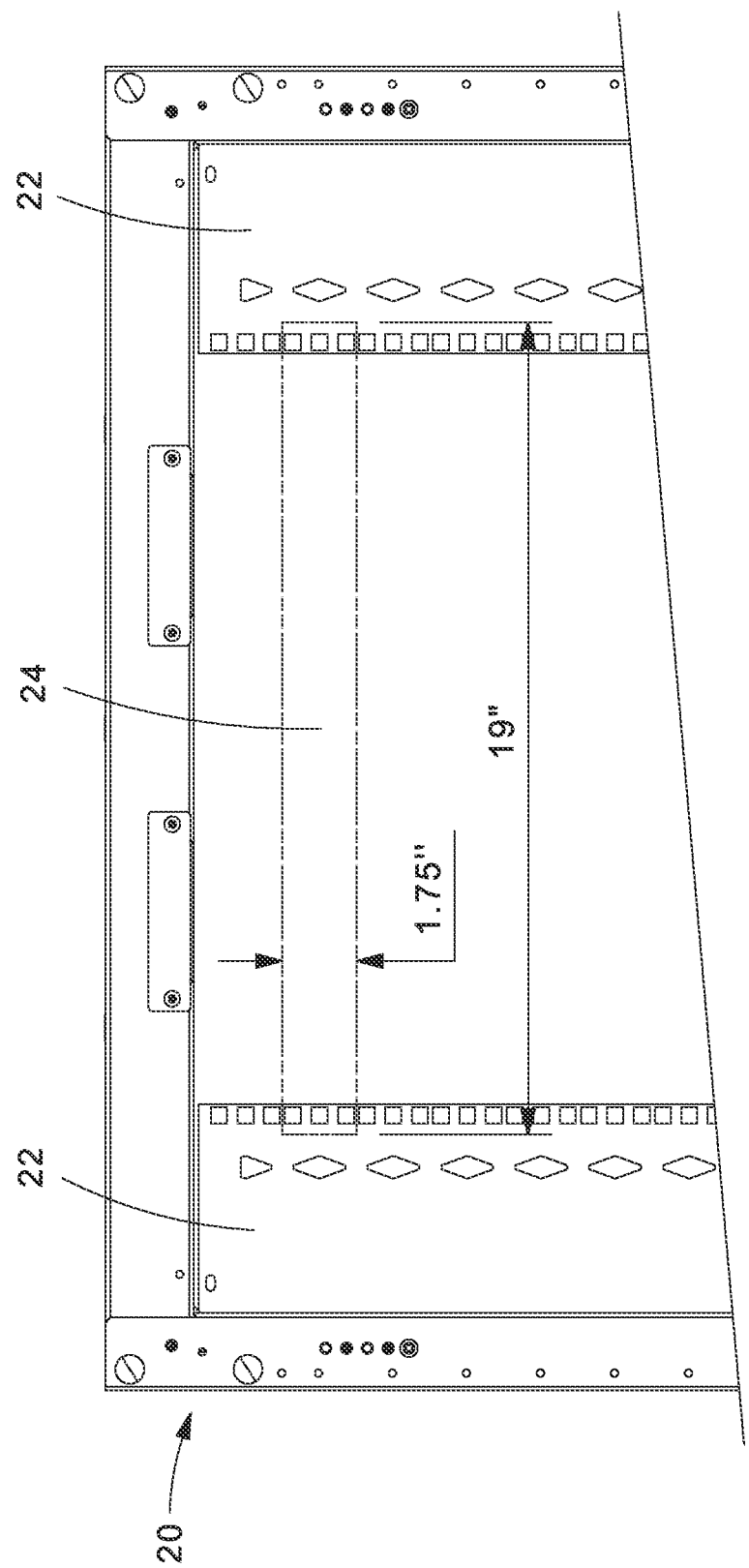
FIG. 1 is a front view of a typical rack unit (RU) within a cabinet in a horizontal orientation.
Figure 2:
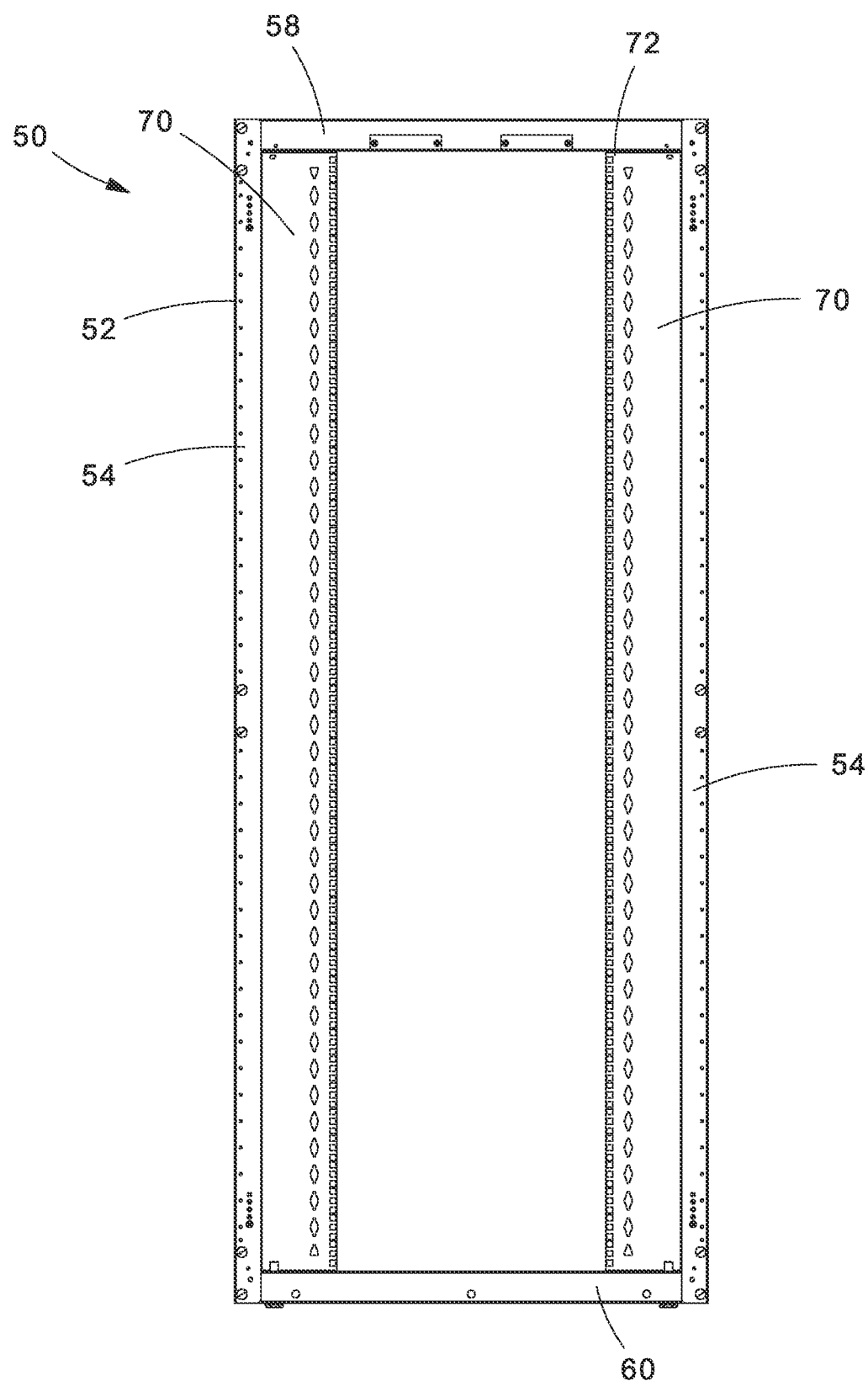
FIG. 2 is a front view of a cabinet with the door removed and equipment rails secured to the cabinet.

FIG. 2 illustrates a front view of a typical cabinet 50 with a frame 52 having front vertical posts 54, a top side to side beam 58, and a bottom side to side beam 60. Equipment rails 70 are secured to the frame 52. As illustrated in FIG. 2, the equipment rails 70 have a plurality of openings 72 for receiving fasteners to mount equipment in the cabinet.

Figure 3:
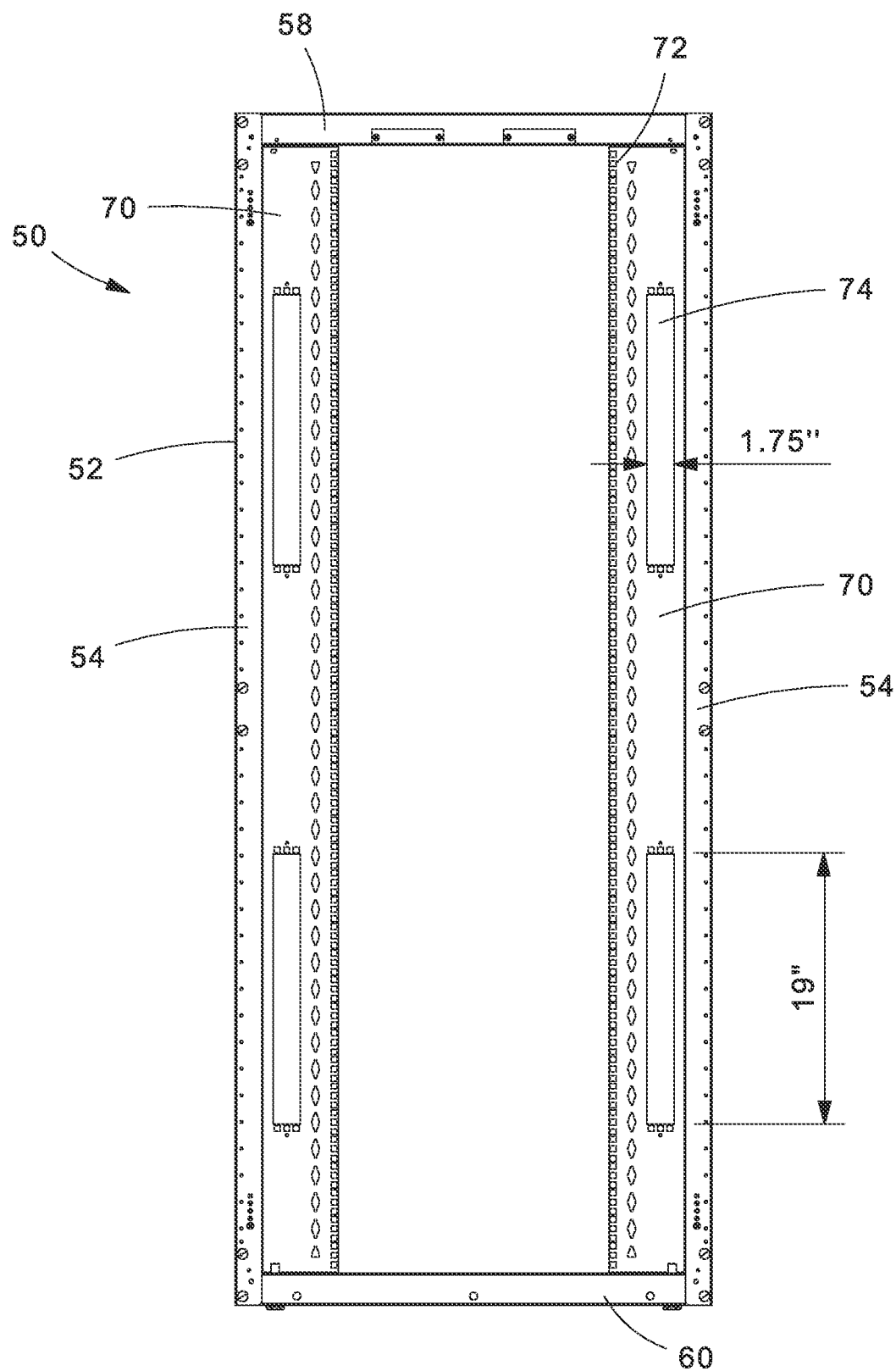
FIG. 3 is a front view of the cabinet of FIG. 2 with vertically orientated rack unit (RU) holes formed in the equipment rails.

FIG. 3 illustrates the equipment rails 70 with vertically orientated holes 74 extending through each equipment rail 70. The vertically oriented holes 74 have a width of 1.75 inches and a height of 19 inches. Thus, the vertically orientated holes 74 are the size of a rack unit (RU).

Figure 4:
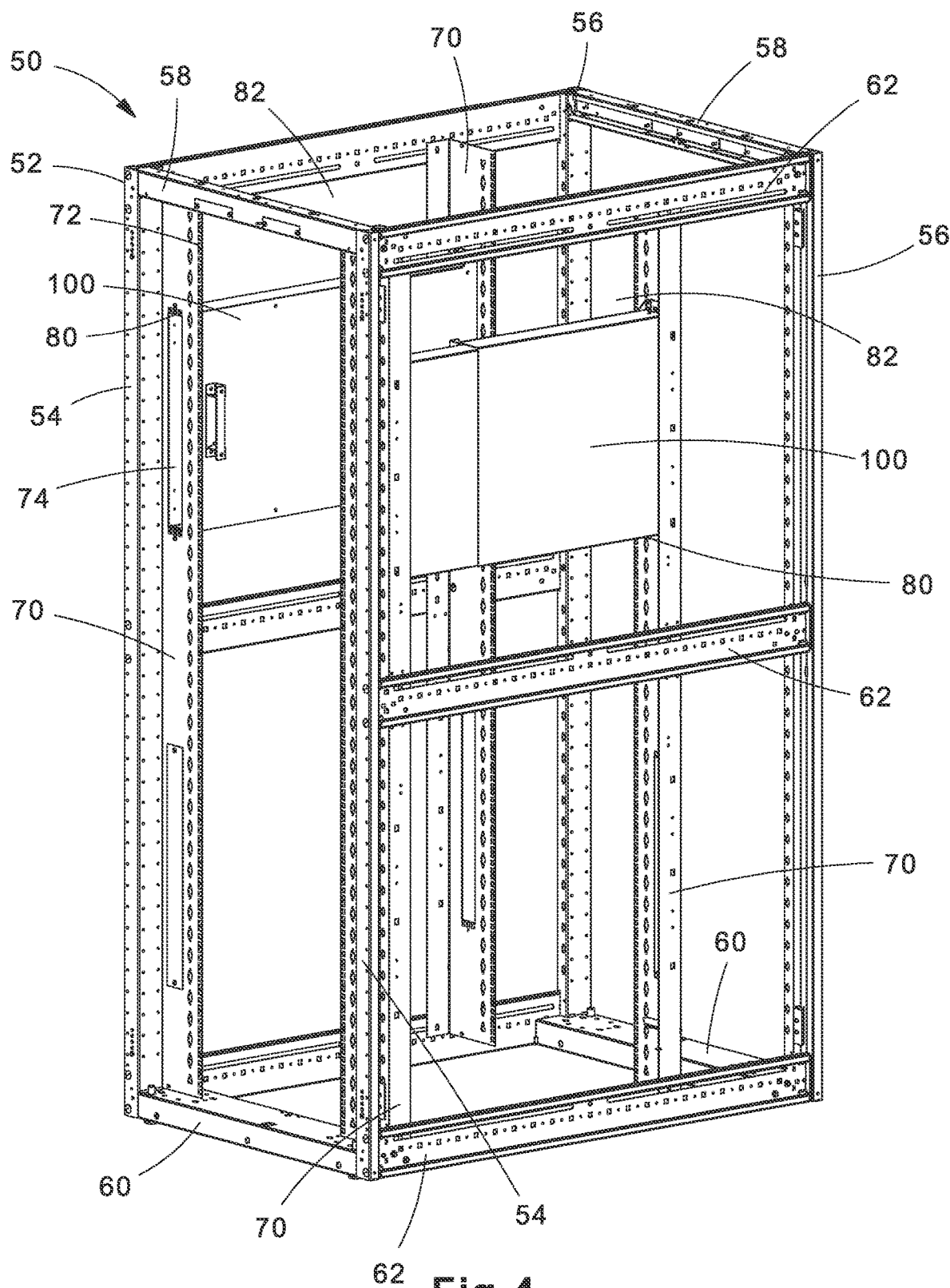
FIG. 4 is a perspective view of the cabinet with air dam enclosures installed in vertically orientated rack unit (RU) holes formed in the equipment rails of FIG. 3.

FIG. 4 illustrates the cabinet 50 and frame 52 with front vertical posts 54, back vertical posts 56, top side to side beams 58, bottom side to side beams 60, and front to back beams 62 extending from the front vertical posts 54 to the back vertical posts 56. The cabinet 50 includes two equipment rails 70 positioned at the front of the cabinet with one equipment rail 70 positioned on the left side of the cabinet and one positioned on the right side of the cabinet. The cabinet 50 also includes two equipment rails 70 positioned at the back of the cabinet with one equipment rail 70 positioned on the left side of the cabinet and one equipment rail positioned on the right side of the cabinet. As illustrated in FIG. 3, the equipment rails 70 in the cabinet have vertically orientated holes 74. As illustrated in FIG. 4, the equipment rails 70 on the left side of the cabinet and the equipment rails 70 on the right side of the cabinet are aligned to create a pathway 80 between the vertically orientated holes 74. Thus, the pathway 80 provides an additional rack unit (RU) space in the cabinet. The rack unit (RU) spaces are located within the cabinet air dam 82, located on the equipment rails 70 of the cabinet 50, between the frame 52 and the plurality of openings 72.

Figure 5:
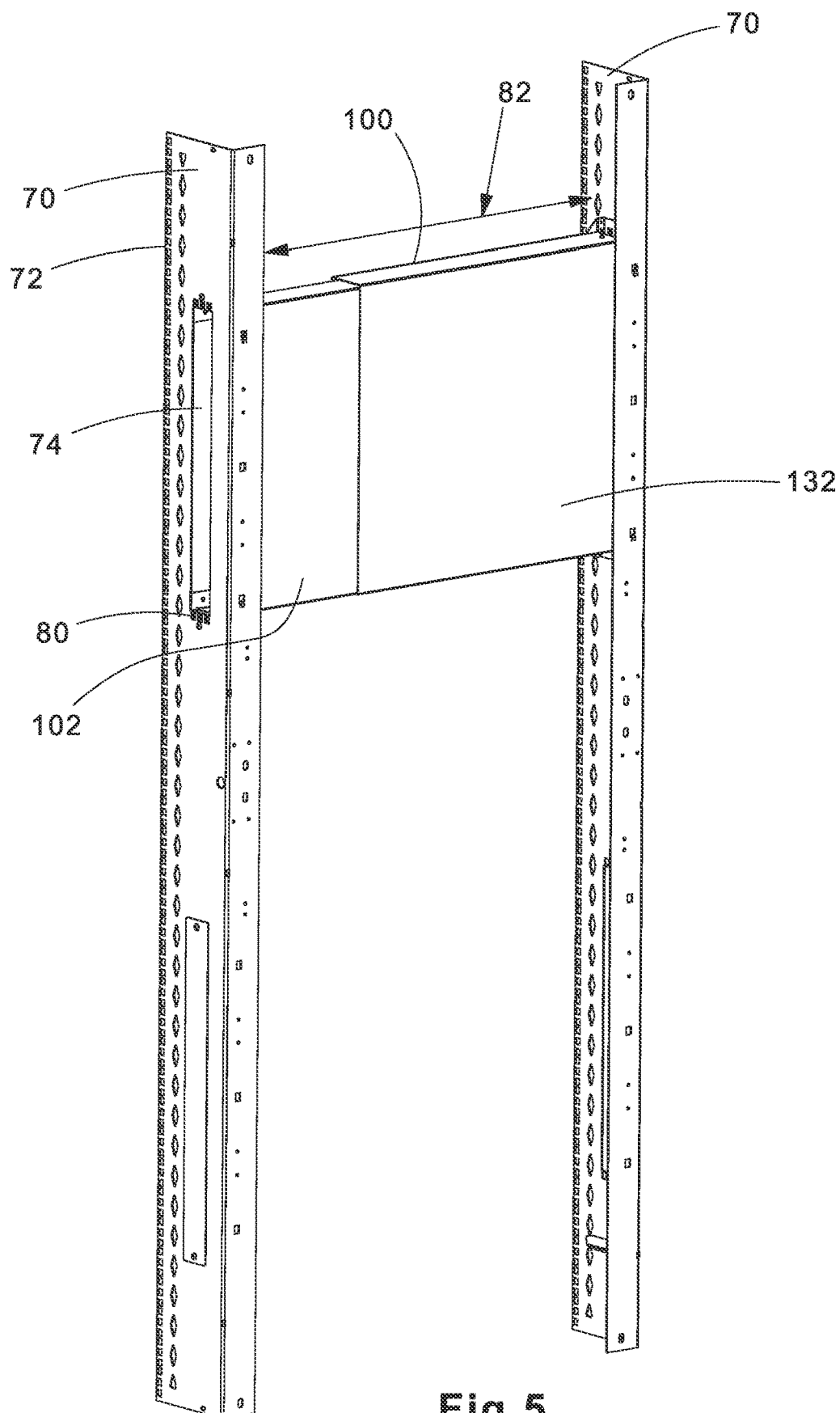
FIG. 5 is a perspective view of the aligned equipment rails of FIG. 4 with the air dam enclosure installed in the vertically orientated rack unit (RU) holes.

As illustrated in FIGS. 4-5, an air dam enclosure 100 is installed in the pathway 80 between the aligned vertically orientated holes 74 in the equipment rails 70. The air dam enclosure 100 connects one of the front equipment rails to one of the back equipment rails. The air dam enclosure 100 provides thermal and structural functionality in a vertically mounted orientation that the cabinet's equipment rails 70 would normally provide in a horizontal orientation.

Figure 6:
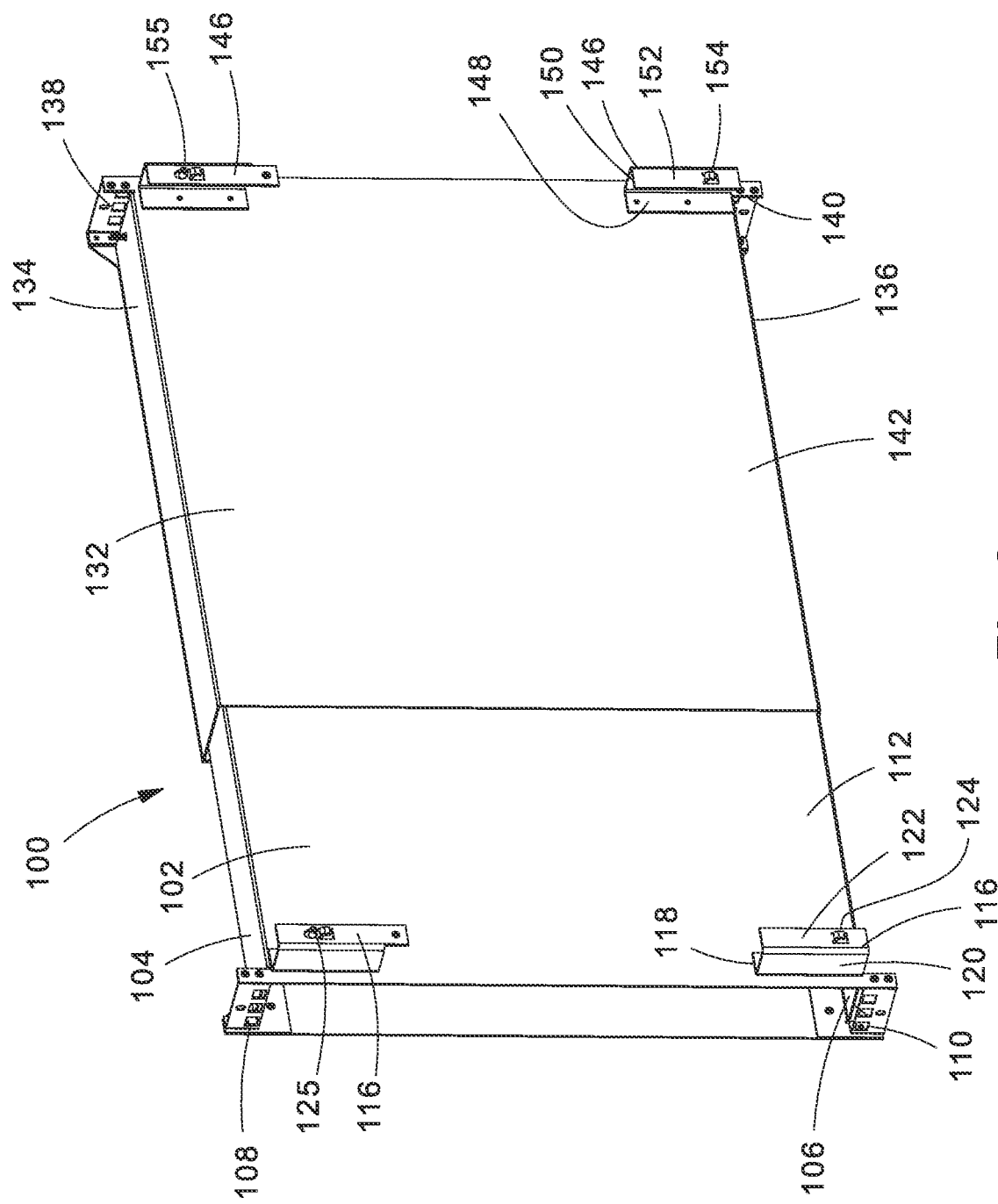
FIG. 6 is a right-side perspective view of the air dam enclosure of FIG. 5.
Figure 7:
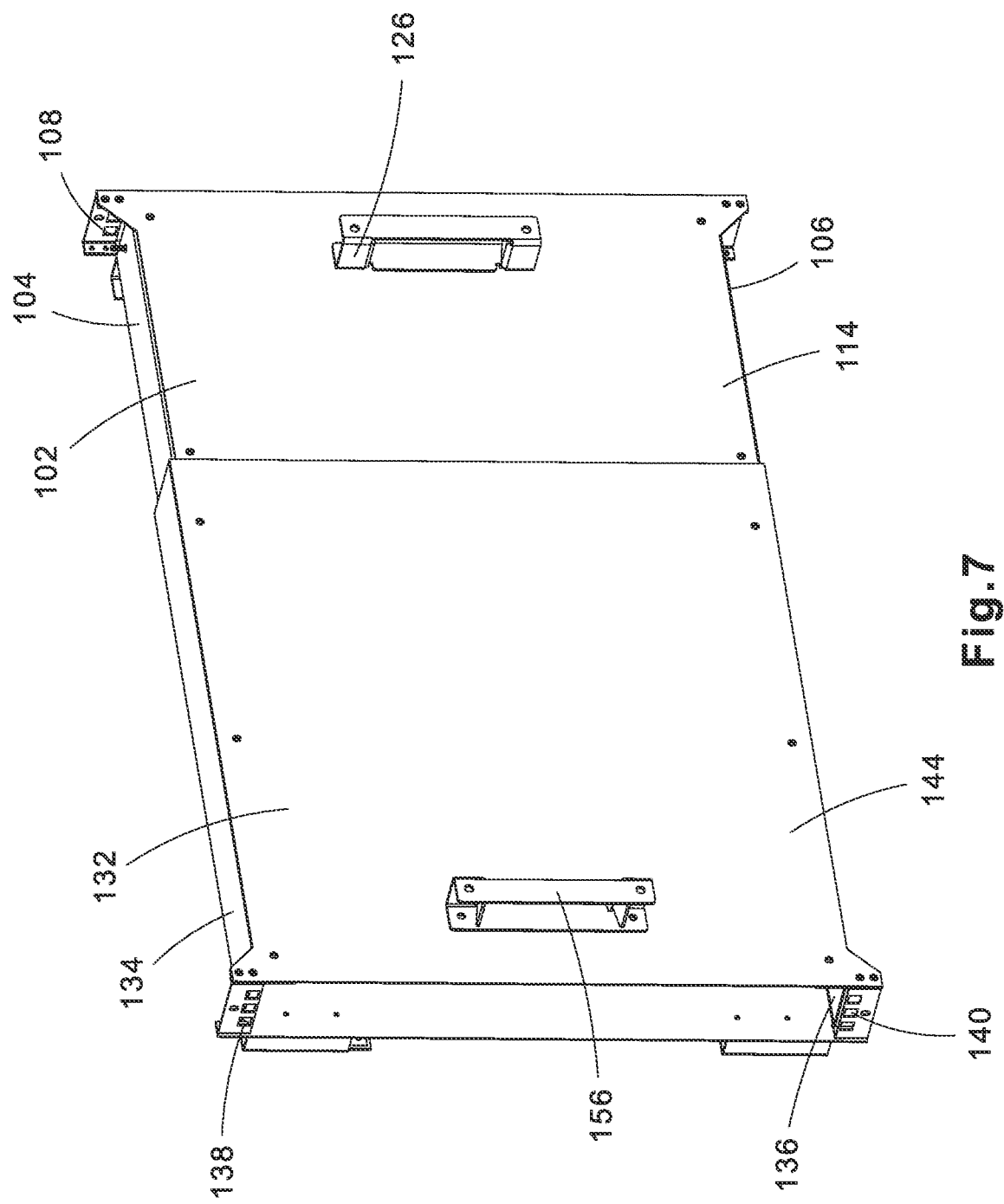
FIG. 7 is a left-side perspective view of the air dam enclosure of FIG. 5.
Figure 8:
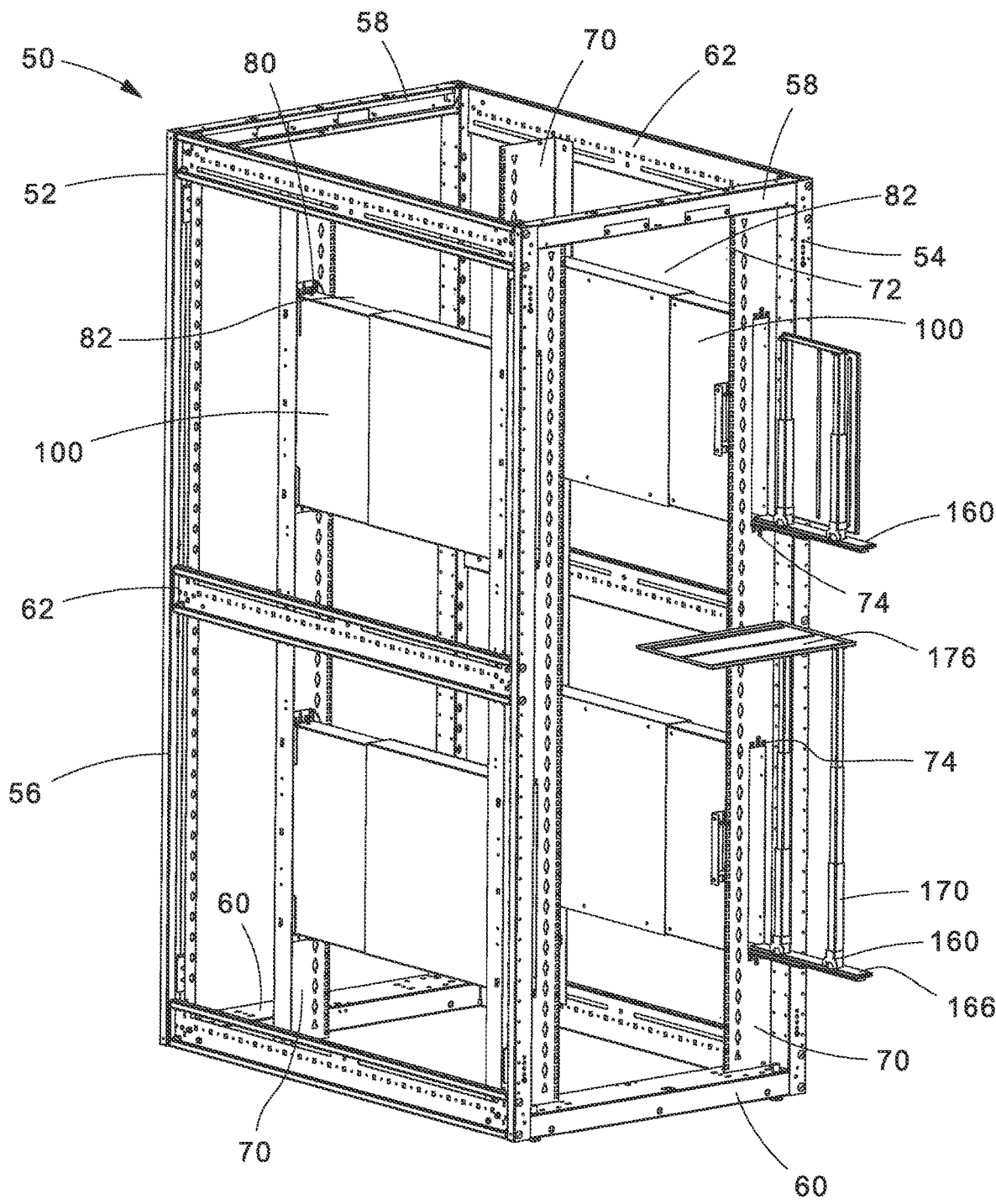
FIG. 8 is a perspective view of the cabinet with laptop trays extending from air dam enclosures of FIG. 4.

FIGS. 6-7 illustrate the air dam enclosure 100 of the present invention. The air dam enclosure 100 includes a first member 102 and a second member 132 that receives the first member 102. The first member 102 and the second member 132 form an enclosure that is an open duct. The front of the first member 102 is sized to align with the vertically orientated hole 74 formed in a front equipment rail 70. The back of the second member 132 is sized to align with the vertically orientated hole 74 formed in a back equipment rail 70. The top 104 and bottom 106 of the first member 102 include a plurality of holes 108, 110, respectively, for receiving a fastener to secure the first member 102 of the air dam enclosure 100 to the front equipment rail 70. The top 134 and bottom 136 of the second member 132 also includes a plurality of holes 138, 140, respectively, for receiving a fastener to secure the second member 132 of the air dam enclosure 100 to the back equipment rail 70.

Alternatively, the air dam enclosure could be installed in the cabinet with the second member secured to the front equipment rail at the front of the cabinet and the first member secured to the back equipment rail at the back of the cabinet, if desired.

As illustrated in FIG. 6, an inner side 112 of the first member 102 and an inner side 142 of the second member 132 each include C-shaped brackets 116, 146, respectively. The brackets 116, 146 are positioned near the top 104 and bottom 106 of the first member 102 and the top 134 and bottom 136 of the second member 132. The brackets 116, 146 are also positioned near the front of the first member 102 and the back of the second member 132. The C-shaped brackets 116, 146 include a first side 118, 148, a main member 120, 150, and a second side 122, 152. The first side 118, 148 of each C-shaped bracket 116, 146 is secured to the first member 102 or second member 132 of the air dam enclosure 100 via fasteners. The second side 122, 152 of each C-shaped bracket 116, 146 includes a downwardly extending hook 124, 154. The second side 122, 152 of each top C-shaped bracket 116, 146 also includes a pin 125, 155 located above the downwardly extending hook 124, 154. The downwardly extending hooks 124, 154 attach to the holes in the equipment rail 70 to hold the air dam enclosure 100 in place until fasteners can be installed in the front of the first member 102 and the back of the second member 132. The pins 125, 155 also assist in holding the enclosure 100 in place and preventing the enclosure 100 from being pulled out of position before secured by the fasteners installed in the front of the first member 102 and the back of the second member 132.

As illustrated in FIG. 7, an outer side 114 of the first member 102 and an outer side 144 of the second member 132 each include a handle 126, 156 for easily adjusting the first and second members 102, 132 with respect to each other and with respect to the equipment rails 70 when installing the air dam enclosure 100 in the cabinet 50.

Since the air dam enclosure 100 is an open duct, several different types of accessories can be installed in each individual air dam enclosure 100. One example is a laptop tray 160, as illustrated in FIGS. 8-13. The laptop tray 160 slides in and out of the air dam enclosure 100 of the present invention. The laptop tray 160 provides a workspace that can support a laptop or similar device, or other accessories that can be used in a cabinet. The air dam enclosure 100 and the laptop tray 160 could be installed in any of the various vertical orientated rack unit (RU) positions in the cabinet 50. The laptop tray 160 has been designed to rotate and move up or down to accommodate the needs of the operator. As a result, the adjustable laptop tray 160 may be adjusted to be positioned at the optimal height for use by the operator. The laptop tray 160 may be installed in the front or the rear of the cabinet depending on application.

Figure 9:
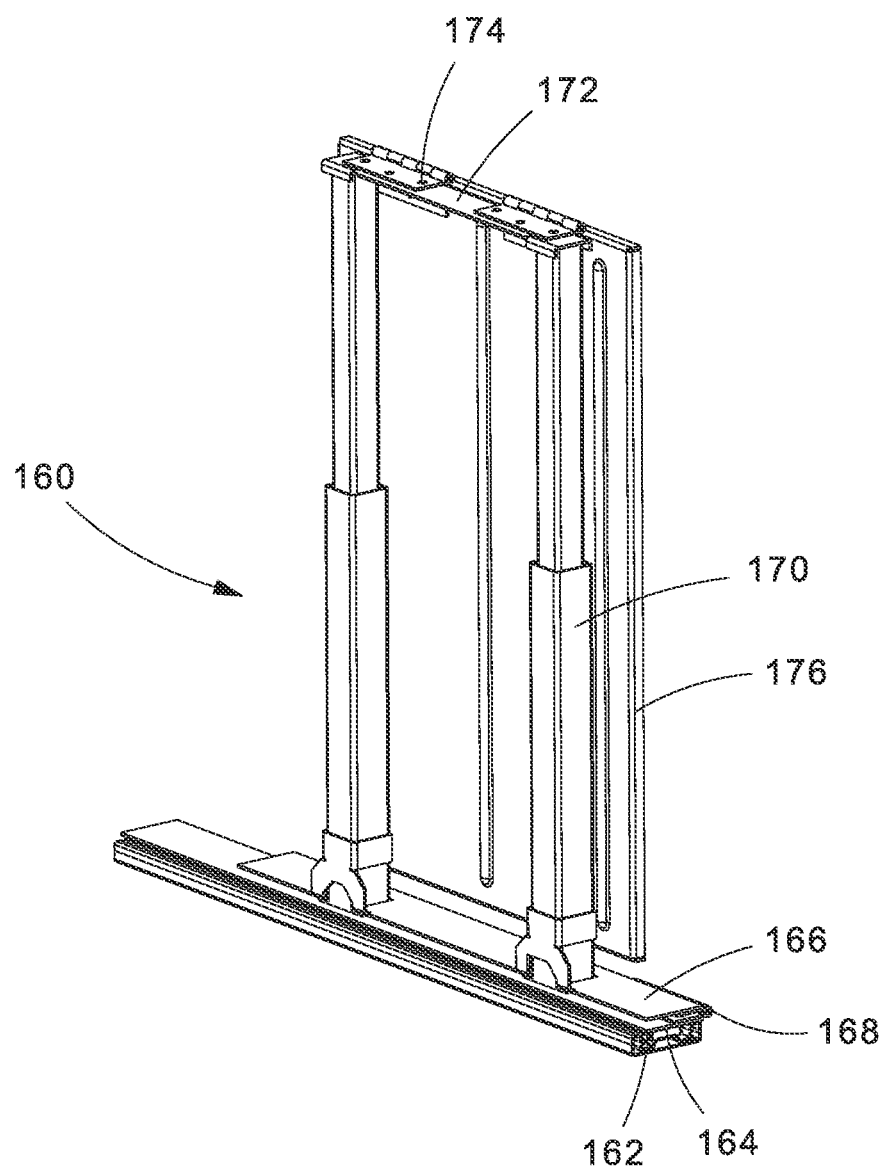
FIG. 9 is a perspective view of the laptop tray of FIG. 8.
Figure 10:
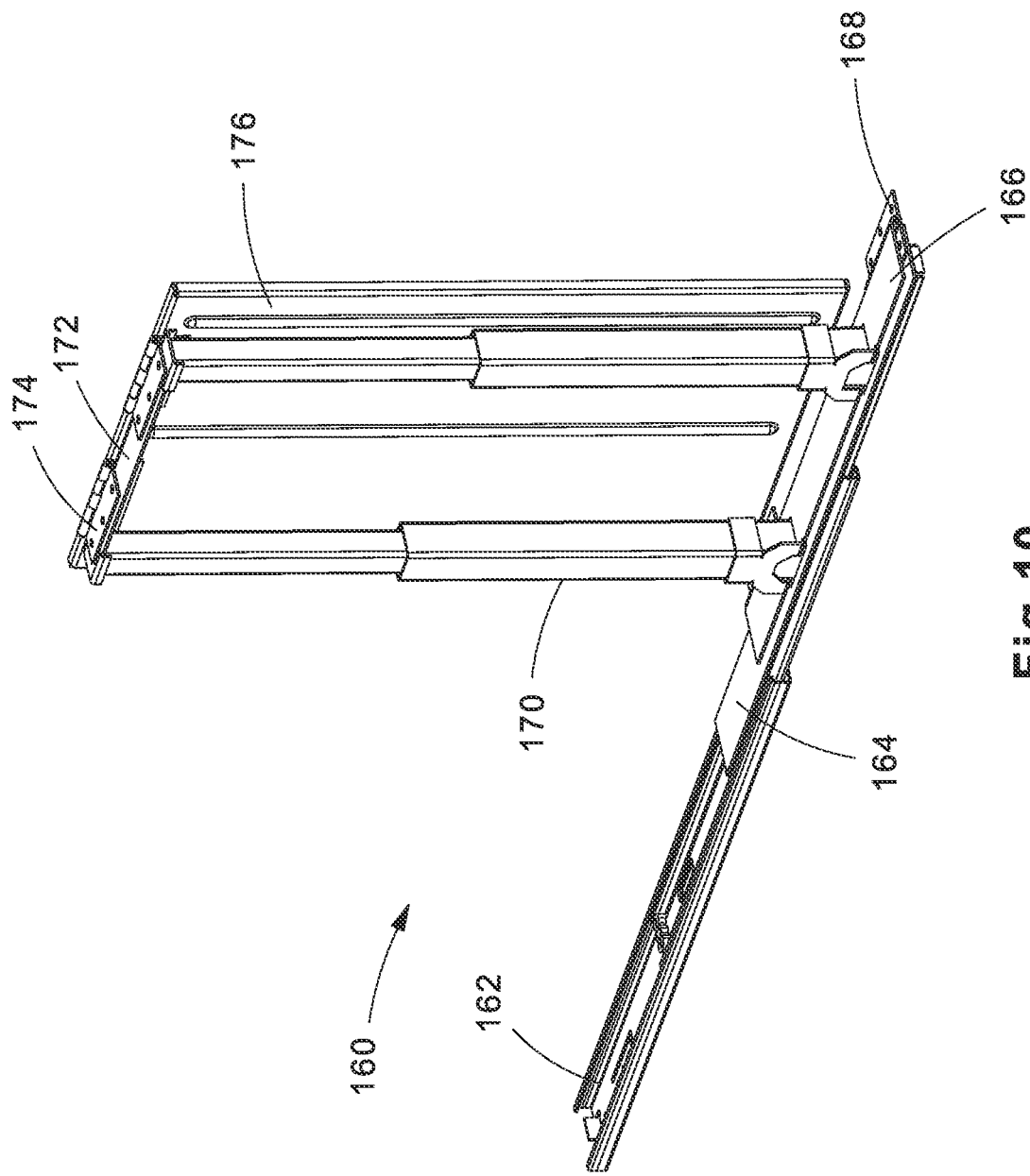
FIG. 10 is a perspective view of the laptop tray of FIG. 8 in an extended position.
Figure 11:
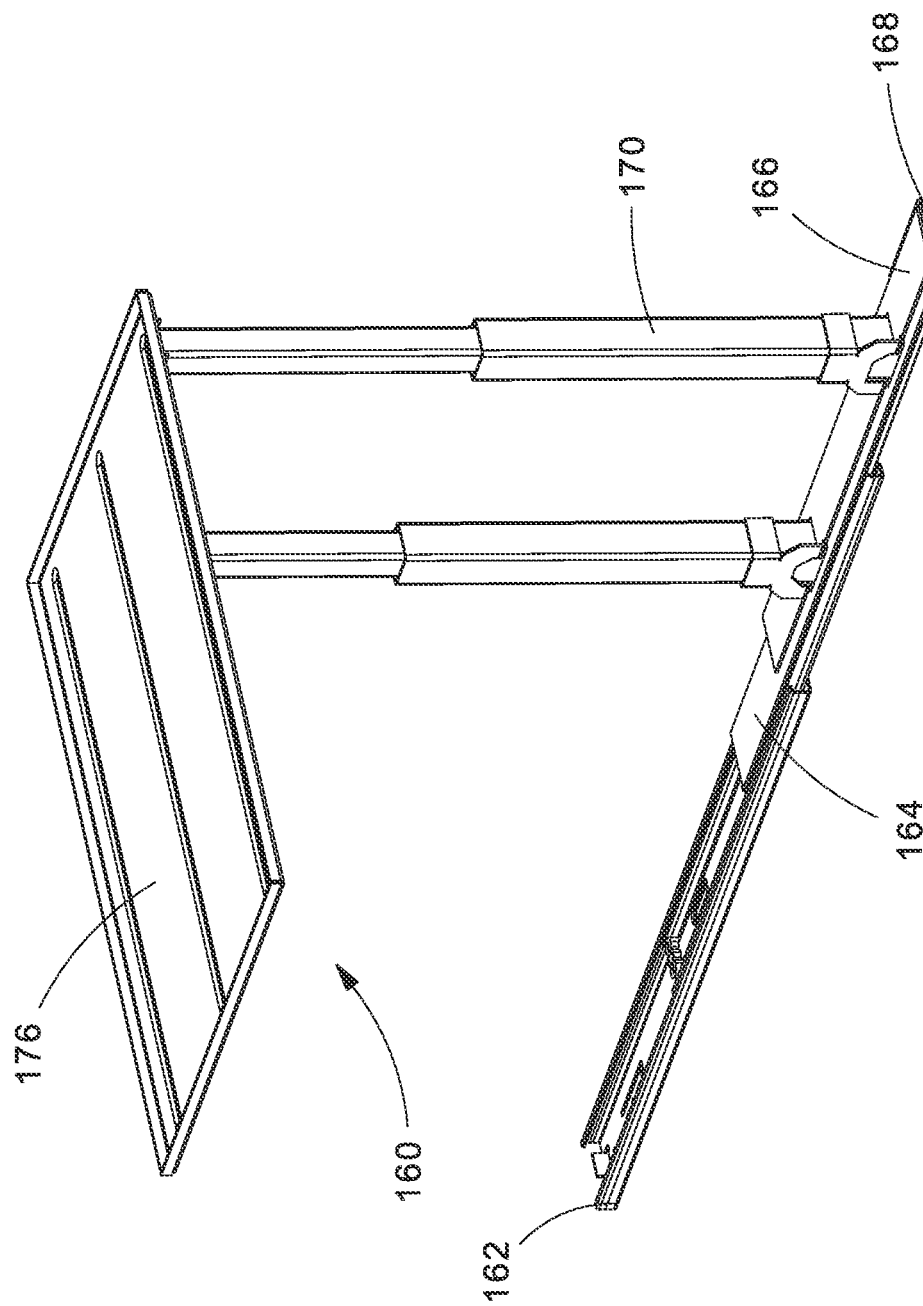
FIG. 11 is a perspective view of the laptop tray of FIG. 8 in a raised position.
Figure 12:
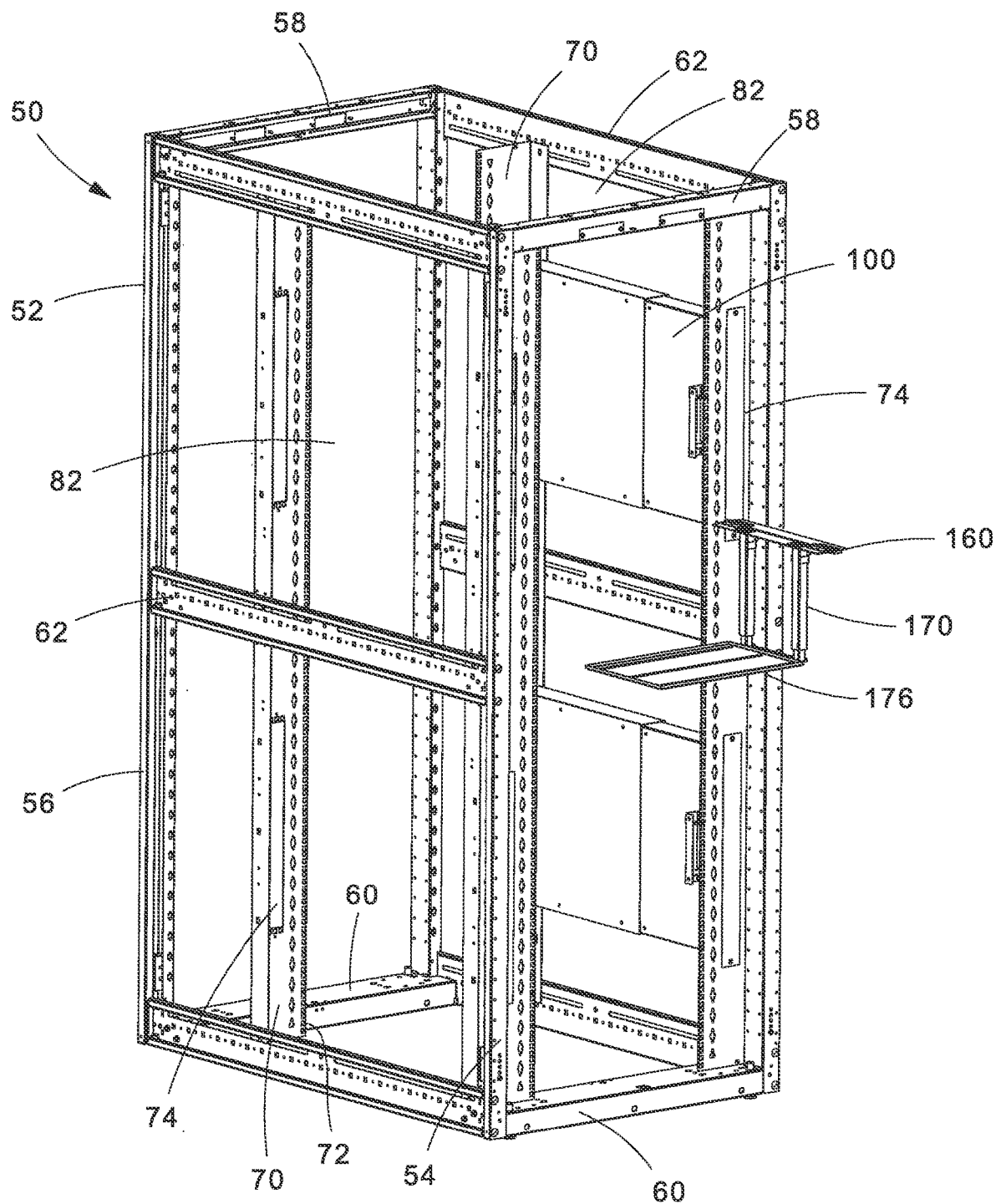
FIG. 12 is a perspective view of the cabinet with a laptop tray extending from an air dam enclosure of FIG. 4 and placed in a lowered position.
Figure 13:
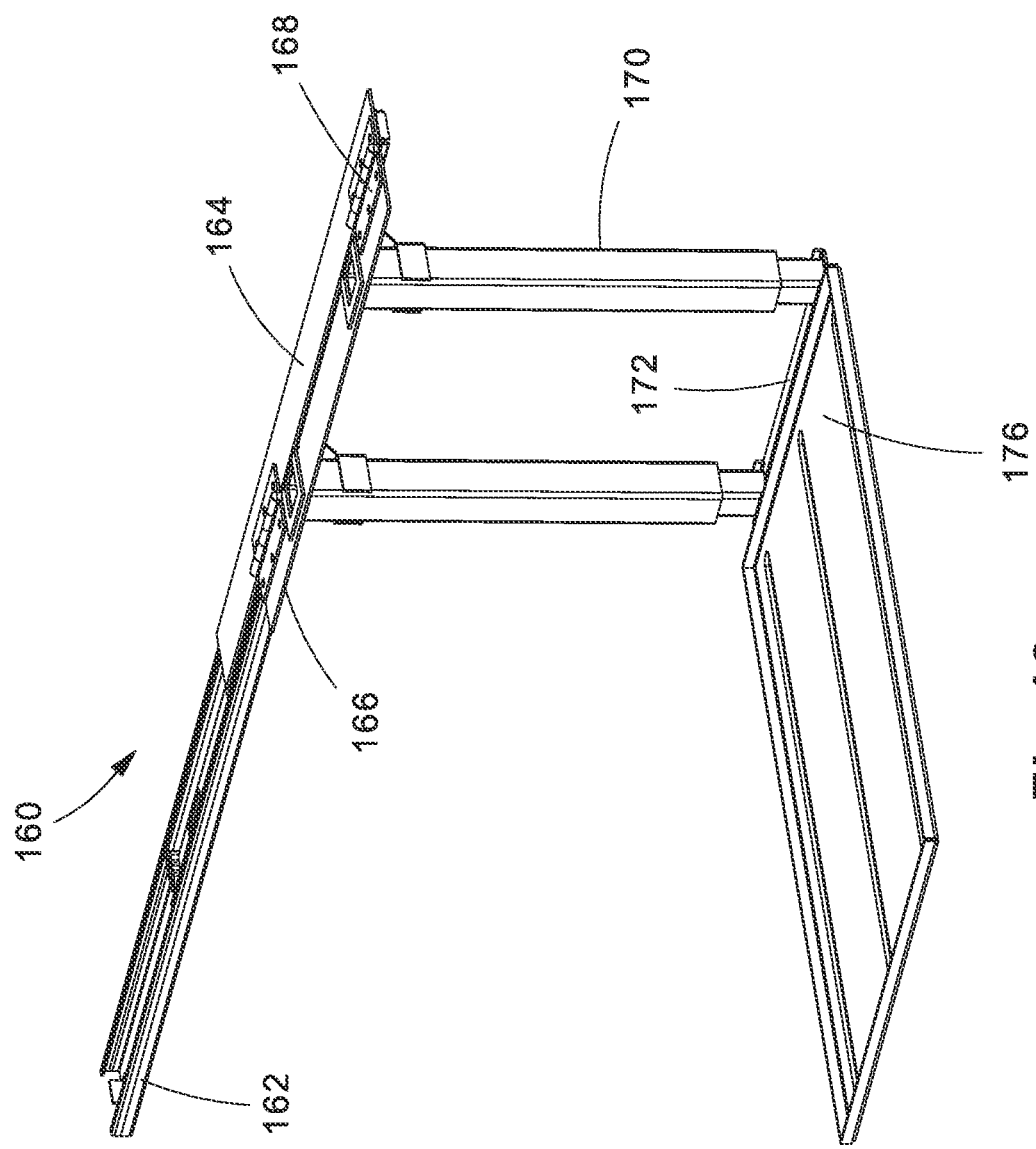
FIG. 13 is a perspective view of the laptop tray of FIG. 12 in a lowered position.

The laptop tray 160 includes a track 162 secured in the air dam enclosure 100. An expandable shelf with a first section 164 and a second section 166 is secured to the track 162. As illustrated in FIGS. 9 and 10, the first section 164 and the second section 166 can be slid along the track 162 and expanded to a desirable position. The second section 166 is rotatably attached to the first section 164 via hinges 168. As a result, the second section 166 may remain positioned above the first section 164 as illustrated in FIG. 10 or may be rotated downward as illustrated in FIG. 13. Telescoping legs 170 are secured to the second section 166. A support member 172 is secured to the distal end of the telescoping legs 170 and a work surface 176 is rotatably secured to the support member 172 via hinges 174.

The laptop tray 160 is not integrated with any computer equipment. It is intended to provide a temporary retractable workspace from either the front or the rear of the cabinet by utilizing the air dam enclosure 100 installed in the vertical rack unit (RU) space formed in the equipment rails 70 in the cabinet 50.

Figure 14:
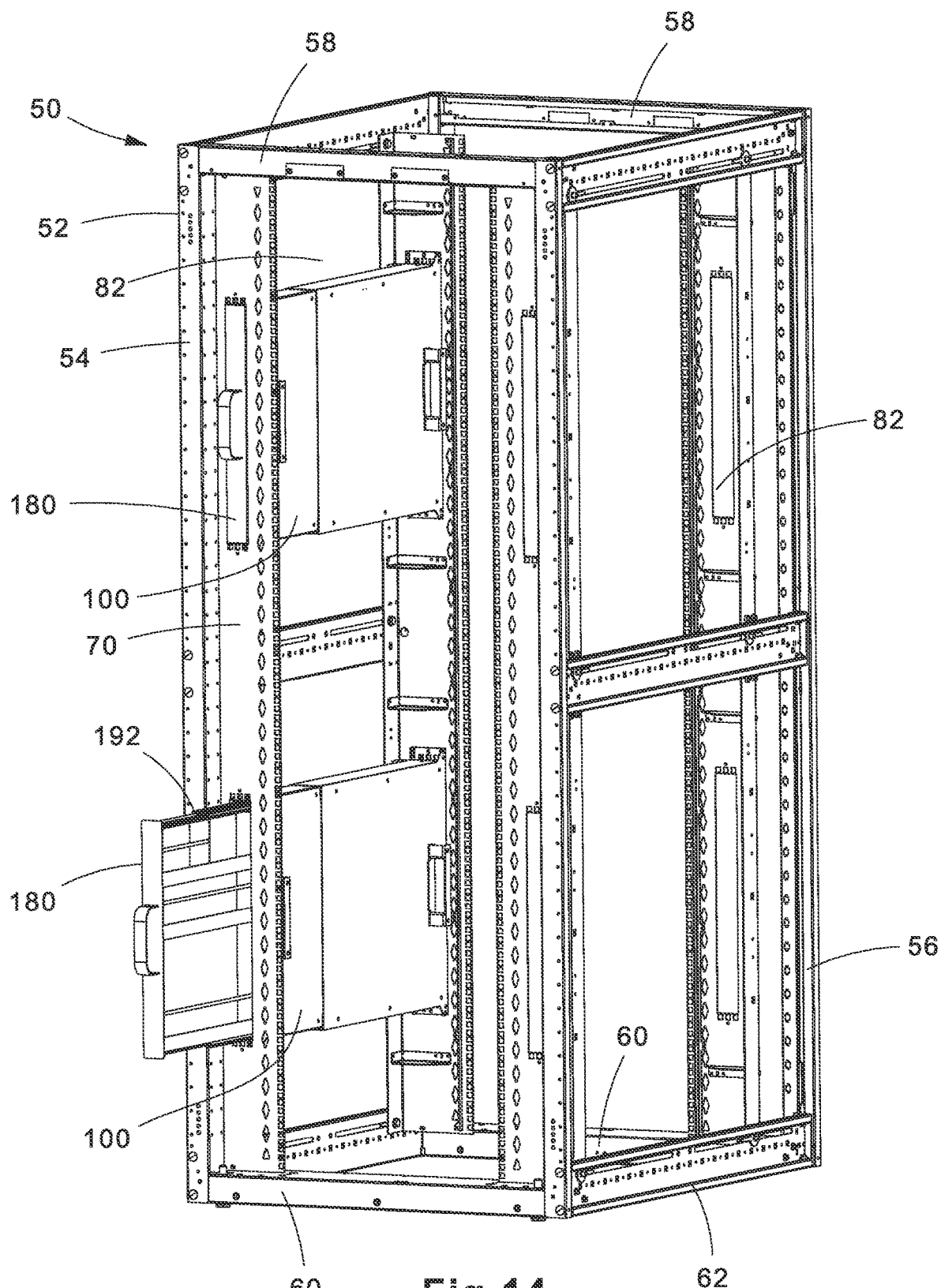
FIG. 14 is a perspective view of the cabinet with a storage tray positioned in the air dam enclosure of FIG. 4.
Figure 15:
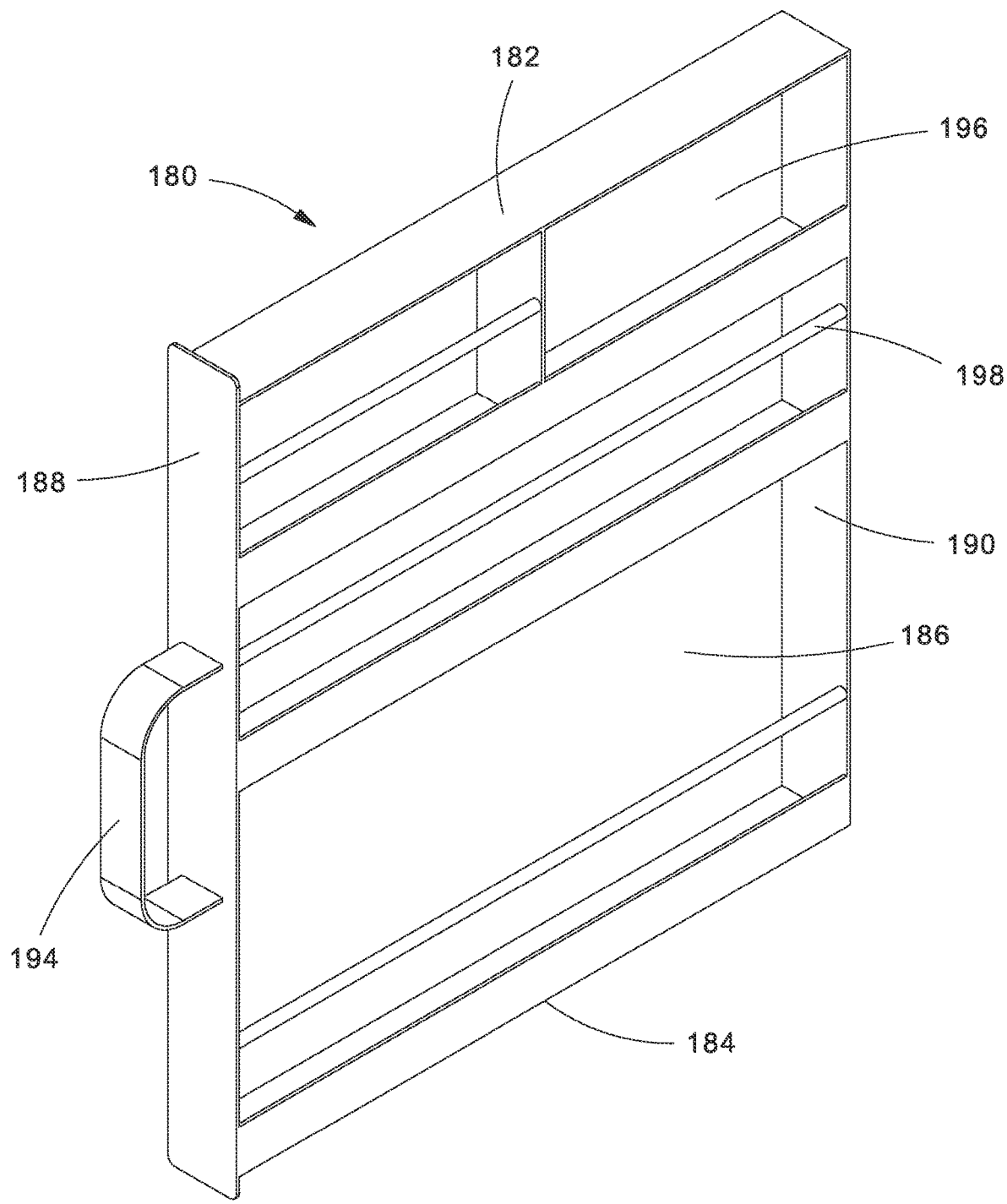
FIG. 15 is a perspective view of the storage tray of FIG. 14.

FIGS. 14-15 illustrate a storage tray 180 which is another example accessory designed to be stored in the air dam enclosure 100. The storage tray 180 slides out of the air dam enclosure 100 and allows for storage of many different types of spare parts and equipment that can be used in a cabinet 50. The storage tray 180 is defined by a top 182, a bottom 184, a side 186, a front 188, and a back 190. Telescoping tracks are secured to the air dam enclosure 100 and the tracks 192 are installed on the outer surfaces of the top 182 and bottom 184 of the storage tray 180. The tracks 192 enable the storage tray 180 to slide with respect to the air dam enclosure 100. The front 188 of the storage tray 180 includes a handle 194 for enabling the user to slide the storage tray 180 with respect to the air dam enclosure 100. The storage tray 180 includes a plurality of compartments 196 with rods 198 or bars. Alternatively, the storage tray 180 may include any arrangement of compartments, mounts, straps, ties, or other fastening or securing devices to facilitate storage in the cabinet. The storage tray 180 may be installed on either the left or the right side of the cabinet. The storage tray 180 may also be installed from the front or the rear of the cabinet, depending on the desired application.

The vertically orientated holes in the equipment rails and the air dam enclosures secured to the equipment rails in the cabinet air dam would allow data center operators to expand potential rack unit (RU) space available to them. Any equipment that can be vertically orientated could be place in the new vertical rack unit (RU) space defined by the air dam enclosure of the present invention.

Furthermore, while the particular preferred embodiments of the present invention have been shown and described, it will be obvious to those skilled in the art that changes and modifications may be made without departing from the teaching of the invention. The matter set forth in the foregoing description and accompanying drawings is offered by way of illustration only and not as limitation.

What is claimed is:

1. A cabinet comprising:
a frame with a pair of front vertical posts, a pair of back vertical posts, top side to side beams, bottom side to side beams, and front to back beams extending from one of the front vertical posts to one of the back vertical posts;
at least one front equipment rail secured to the frame and at least one back equipment rail secured to the frame, the at least one front equipment rail and the at least one back equipment rail each have at least one vertically orientated hole extending there through, wherein the at least one vertically orientated hole of the at least one front equipment rail is aligned with the at least one vertically orientated hole of the at least one back equipment rail to create a pathway between the vertically orientated holes; and
an enclosure installed in the pathway between the aligned vertically orientated holes in the at least one front equipment rail and the at least one back equipment rail, whereby the enclosure connects the at least one front equipment rail to the at least one back equipment rail wherein an adjustable tray for a providing a retractable workspace is installed in the enclosure.

2. The cabinet of claim 1, wherein the adjustable tray slides in and out of the enclosure, rotates and adjusts vertically to provide the retractable workspace.

3. The cabinet of claim 1, wherein the adjustable tray includes a track secured to the enclosure and an expandable shelf with a first section and a second section, the second section is secured to the track, wherein the first section and the second section slide along the track to an expanded position.

4. The cabinet of claim 3, wherein hinges attach the second section to the first section.

5. The cabinet of claim 3, wherein the adjustable tray further includes telescoping legs secured to the second section, a support member is secured to a distal end of the telescoping legs, and a work surface is rotatably secured to the support member by hinges.

6. A cabinet comprising:
a frame with a pair of front vertical posts, a pair of back vertical posts, top side to side beams, bottom side to side beams, and front to back beams extending from one of the front vertical posts to one of the back vertical posts;
at least one front equipment rail secured to the frame and at least one back equipment rail secured to the frame, the at least one front equipment rail and the at least one back equipment rail each have at least one vertically orientated hole extending there through, wherein the at least one vertically orientated hole of the at least one front equipment rail is aligned with the at least one vertically orientated hole of the at least one back equipment rail to create a pathway between the vertically orientated holes; and
an enclosure installed in the pathway between the aligned vertically orientated holes in the at least one front equipment rail and the at least one back equipment rail wherein a storage tray for storing spare parts and equipment is installed in the enclosure wherein the storage tray includes a top with an outer surface, a bottom with an outer surface, a side, a front and a back;
a track is installed on the outer surface of the top and the outer surface of the bottom of the storage tray for allowing the storage tray to slide out of the enclosure.

7. The cabinet of claim 6, wherein the front of the storage tray includes a handle for engaging the storage tray to slide the storage tray with respect to the enclosure.

* * * * *